United States Patent
Röhr

(10) Patent No.: US 7,254,073 B2
(45) Date of Patent: Aug. 7, 2007

(54) MEMORY DEVICE HAVING AN ARRAY OF RESISTIVE MEMORY CELLS

(75) Inventor: Thomas Röhr, Aschheim (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/238,116

(22) Filed: Sep. 29, 2005

(65) Prior Publication Data

US 2007/0070681 A1   Mar. 29, 2007

(51) Int. Cl.
*G11C 7/00* (2006.01)
*G11C 11/00* (2006.01)

(52) U.S. Cl. ............... 365/203; 365/158; 365/171; 365/173

(58) Field of Classification Search .......... 365/203, 365/158, 171, 173
See application file for complete search history.

(56) References Cited

U.S. PATENT DOCUMENTS

| | | | |
|---|---|---|---|
| 5,390,150 A | 2/1995 | Kwak | |
| 6,418,049 B1 | 7/2002 | Kozicki | |
| 6,909,656 B2 * | 6/2005 | Moore et al. | 365/203 |
| 6,937,528 B2 * | 8/2005 | Hush et al. | 365/203 |
| 6,954,385 B2 * | 10/2005 | Casper et al. | 365/203 |
| 2002/0154531 A1 | 10/2002 | Lowrey | |
| 2003/0123281 A1 | 7/2003 | Iwata | |
| 2003/0128612 A1 | 7/2003 | Moore | |
| 2004/0184331 A1 | 9/2004 | Hanzawa | |
| 2005/0127524 A1 * | 6/2005 | Sakamoto et al. | |

OTHER PUBLICATIONS

M.N. Kozicki et al., "Can Solid State Electrochemistry Eliminate the Memory Scaling Quandary", Proceedings, IEEE-Nand 2002.
Ralf Symanczyk et al., "Electrical Characterization of Solid State Ionic Memory Elements" (2003).

\* cited by examiner

*Primary Examiner*—Trong Phan
(74) *Attorney, Agent, or Firm*—Dicke, Billig, & Czaja, P.L.L.C.

(57) ABSTRACT

A memory device including an array of resistive memory cells, which are arranged in columns and rows, and wherein each resistive memory cell each is connected to a word line, to a bit line, and to a reference electrode. The word lines are assigned to the rows and the bit lines are assigned to the columns. The resistive state of the resistive memory cells corresponds to a logical state thereof, and the memory device further comprises an evaluation device, which is coupled to the bit lines, for evaluating the resistive state of at least one of the resistive memory cells during a reading operation. The respective resistive memory cell is selected by addressing the word line to which the resistive memory cell is connected.

26 Claims, 4 Drawing Sheets

MEMORY DEVICE HAVING AN ARRAY OF RESISTIVE MEMORY CELLS

TECHNICAL FIELD OF THE INVENTION

The present invention relates to a memory device comprising an array of resistive memory cells.

BACKGROUND OF THE INVENTION

Conventional electronic data memories, such as DRAM or Flash-RAM, are facing certain limitations as demands to modern data memories are steadily increasing. Above all, modern data memories must meet the requirement to combine a high density of information, fast memory access speed, and non-volatility. The latter non-volatility is increasingly important, since the memory content must be reliably maintained without supplying energy in—for example—mobile applications.

Present electronic data memory concepts, such as the DRAM or the Flash-RAM, store the data in information units based on charged or uncharged capacitors. In the case of a DRAM, these capacitors must be refreshed continuously, as they are kept small in order to achieve a high density of information. Therefore, a separate electronic circuitry for constant reading and rewriting of the information content is necessary.

Increasing the capacitors' size, as in a Flash-RAM, allows for the storage of information for a longer time span. The increased size of the data storage units however, then substantially limits integration and access speed. Additionally, higher operating voltages are required in a Flash-RAM, which further impose restrictions on integration and access speed.

In order to combine non-volatility with fast access and high integration, alternatives to the DRAM and the Flash-RAM are subject to intense scientific and industrial research. Amongst others, the so-called resistive data storage media are most promising candidates for such a replacement and an enhancement of current technologies.

Resistive data memories take advantage of various physical effects to cause a distinguishable and stable change of the electric resistance of special material systems. These systems include, for example, perovskite materials, phase change materials, and the so-called solid electrolytes. Memory cells employing solid electrolytes are also known as programmable metallization cells (PMC) or conductive brigding cells wherein an entire memory is referred to as CB-RAM. In a solid electrolyte a stable conductive bridging is formed by paths of metal ions being mobile in the solid electrolyte. These paths can be generated and decomposed by means of an electric field.

Similar to a classical DRAM device, a memory device employing a resistive memory medium will comprise memory cells, which are arranged in an array of rows and columns. In this way billions of memory cells are integrated on a single chip. Since a large array of memory cells results in thousands of word and bit lines, it is furthermore desirable to pool a set of bit lines in order to simplify the external electronic circuitry. This pooling is usually carried out by means of a multiplexing unit, which connects one bit line out of a set of bit lines to an evaluation unit, while disconnecting the remaining bit lines.

Although the integration of a multiplexing unit greatly simplifies the handling of large numbers of bit lines, only one bit line out of a set of bit lines is connected to an output port at a time. The remaining bit lines are disconnected from all external circuitry and hence may electrically float. This usually results in an undesired charging of the respective bit lines, which is mainly due to capacitive coupling between neighbouring bit lines and leakage currents.

When a floating bit line is to be evaluated it must be first discharged and brought to a respective potential. Since the measured potential of a bit line eventually determines the logical state of the memory cell during a reading operation, compensation for parasitic charging effects of the bit lines must be suppressed. One method for eliminating these undesired charging effects is to connect a bit line to the evaluation unit by a multiplexing unit and to wait until all parasitic charge on the bit line has levelled trough the low impedance of the evaluation unit. This method requires additional time for every reading operation and hence strongly limits access speed and performance of the memory device.

SUMMARY OF THE INVENTION

The present invention provides an improved memory device comprising an array of resistive memory cells.

According to one embodiment of the present invention, there is a memory device, wherein the memory device comprises an array of resistive memory cells, which are arranged in columns and rows. The resistive memory cells are connected to a word line, to a bit line, and to a reference electrode, wherein the word lines are assigned to the rows and the bit lines are assigned to the columns. The resistive states of the resistive memory cells correspond to logical states of the resistive memory cells. The memory device further comprises an evaluation device for evaluating the resistive state of the resistive memory cells. The evaluation device is coupled to the bit lines and evaluates the resistive state during a reading operation, wherein the respective resistive memory cell is selected by addressing the word line to which the resistive memory cell is connected. The memory device further comprises a charging device which is coupled to the bit lines. The charging device is capable of charging the bit lines to a predetermined pre-reading bit line potential before carrying out a reading operation.

During a reading operation the evaluation device evaluates the resistive state of a resistive memory cell. In general, the evaluation device is able to determine the resistive state by means of measuring an electric voltage or an electric current through the resistive memory cell. The resistive memory cells are connected to word lines, to bit lines, and to reference electrodes. A memory cell is selected via addressing the respective word line and connecting the respective bit line to the evaluation device. A current or a voltage may then be detected between the bit line and the reference electrode.

When no reading operation is effective, the bit line may be disconnected from the evaluation device, and hence may electrically float, for the bit lines being subject to parasitic and uncontrolled charging effects. The bit line changes its potential due to the capacitive coupling and electrical leaks between adjacent bit lines or other components of the memory device. Therefore, the bit line may be at an uncontrolled potential at the time when the evaluation device starts evaluating the resistive state of a resistive memory cell, being connected to the respective bit line. In order to evaluate the state of the resistive memory cell in a reliable manner, the uncontrolled potential of the bit line must be brought to a well defined pre-reading potential before the reading operation may commence.

Since the charging effects are uncontrolled and may furthermore vary over the period of operation, the evaluation device waits for a sufficiently long time span to allow for a reliable reading operation. This is causing a substantial delay before every reading operation and strongly diminishes the overall memory device performance.

According to another embodiment of the present invention, the memory device comprises a charging device, which is coupled to the bit lines. This charging device is capable of charging the bit lines to a well defined potential at times when no reading operation is effective on the respective bit line. Since the charging device is coupled to all bit lines, it may connect the bit lines to a well defined pre-reading potential between reading operations. When the evaluation device is to carry out a reading operation, the charging device has kept the respective bit lines at the well defined potential, and the evaluation device may initiate the reading operation immediately. The inventive device therefore does not require a delay before reading operations, and hence possesses an increased overall device performance.

According to still another embodiment of the present invention, the memory device further comprises a control device for controlling the charging device. The control device is suitable for controlling the charging device such that the charging device cycles the charging of the bit lines at dated periods of time. In this way, the charging device is controlled to bring the bit lines to a pre-reading bit line potential in well defined time intervals. The dated periods of time are chosen by the control device such that a charging operation does not interfere with a reading operation while a charging operation is carried out as often as required for a reliable operation of the evaluation device.

According to yet another embodiment of the present invention, the control device controls the charging device such that a charging operation of the bit lines is carried out at least every one thousand reading operations. In this way, it is assured that the bit lines are brought to the well defined pre-reading bit line potential at least every one thousand reading operations.

According to a further embodiment of the present invention, the pre-reading bit line potential to which the bit lines are brought by the charging device matches approximately the bit line potential during a reading operation. In order to determine the resistive state of a resistive memory cell an electric voltage is applied between the respective bit line and the reference electrode. This voltage corresponds to a bit line potential during a reading operation. If the charging device brings the bit lines during a charging operation to this bit line reading potential, the evaluation device may immediately initiate a reading operation. In this way, no delay occurs before a reading operation. According to a further embodiment of the present invention the absolute difference between the pre-reading bit line potential and the bit line potential during a reading operation is less than 2 Volts, preferably less than 1 Volt, and most preferably less than 0.1 Volts.

According to a further embodiment of the present invention, the charging device is programmed such that a faulty bit line is excluded from the bit line charging operation. Although modern manufacturing processes for memory devices and other electronic integrated devices are highly sophisticated, structuring of various materials at the scale of only a few nanometres is often subject to deviations from the intentionally defined structures. The deviations may result in local malfunctions of the device, such as electrical shorts or a high resistive impedance.

A rather usual fault in the production of highly integrated memory devices is a short between a bit and a word line. According to this embodiment of the present invention, the charging device is programmed such that the faulty bit line, which is in undesired short contact with a word line, is excluded from the bit line charging operation. In this way, an interference between the bit line and the respective word line during a charging operation can be prevented.

According to a another embodiment of the present invention, the charging device comprises resistive memory cells, wherein the charging device comprises a resistive memory cell for each bit line. The resistive memory cells of the charging device are programmed such that they are in a low resistive state. The inventive device therefore is able to implement the charging device with a minimum of additional components or functional structures. Simply one row of resistive memory cells is assigned to the charging device which then can charge every bit line, since every bit line is connected to a memory cell of that row. The inventive device according to this embodiment of the present invention allows for a most simple implementation of the present invention. Either an additional row of resistive memory cells is realized within the array for being operated as the charging device, or one row of the array of resistive memory cells is assigned to the charging device and the respective word line of that row is addressed accordingly.

According to a further embodiment of the present invention, the reference electrodes of the resistive memory cells of the charging device are coupled to a common charging reference electrode. According to this embodiment, the charging device is able to bring the bit lines to the potential of the common charging reference electrode, without interfering with the reference electrodes of the remaining resistive memory cells. Independently from the latter the charging device may bring the bit lines to an arbitrary well defined potential.

According to still another embodiment of the present invention, the resistive memory cells of the charging device are connected to a common charging word line. Addressing this common charging word line then activates the charging device, and all bit lines are brought to a well defined pre-reading potential according to the programming of the resistive memory cells of the charging device.

According to a further embodiment of the present invention, the resistive memory cells comprise a resistive memory element and a selection transistor. The resistive memory element and the selection transistor are arranged in a series connection between the corresponding bit line and the reference electrode. The selection transistor is further connected to the corresponding word line. With the arrangement according to this embodiment of the present invention, the resistive state of a resistive memory element, which are arranged in an array of rows and columns, can be easily accessed via addressing the corresponding word line and applying electrical signals between the corresponding bit line and the reference electrode.

According to a further embodiment of the present invention, the resistive memory element comprises a solid electrolyte element, which preferably includes at least one of Germanium-Selenide ($GeSe$, $GeSe_2$), Germanium-Sulfide ($GeS$, $GeS_2$), Germanium-Telluride ($GeTe$), Silicon-Selenide ($SiSe$), Silicon-Sulfide ($SiS$), Lead-Sulfide ($PbS$), Lead-Selenide ($PbSe$), Lead-Telluride ($PbTe$), Tin-Sulfide ($SnS$), Tin-Selenide ($SnSe$), Tin-Telluride ($SnTe$), Zinc-Sulfide ($ZnS$), Zinc-Selenide ($ZnSe$), Cadmium-Sulfide ($CdS$), Cadmium-Selenide ($CdSe$), Copper ($Cu$), Silver ($Ag$), Zinc ($Zn$), Lithium ($Li$), or Sodium ($Na$). According to this embodiment of the present invention the resistive memory element may be manufactured from a solid electrolyte. Solid electrolytes represent a very promising and already rather sophisticated material system for resistive memory cells.

According to yet a further embodiment of the present invention, the memory device comprises a multiplexing device which is coupled to at least two bit lines. The multiplexing device is able to connect one bit line to the evaluation device while disconnecting the remaining bit lines, which are coupled to the multiplexing device, from the evaluation device. According to this embodiment, a set of bit lines can be pooled and only one evaluation device is necessary for more than one bit line. Since not all bit lines have to be accessed simultaneously, the use of a multiplexing device greatly simplifies the device layout and strongly reduces the number of active components, which have to be integrated in the memory device.

BRIEF DESCRIPTION OF THE DRAWINGS

The present invention is described in more detail below with reference to exemplary embodiments and the drawings, in which.

DETAILED DESCRIPTION OF THE INVENTION

Figure 1:
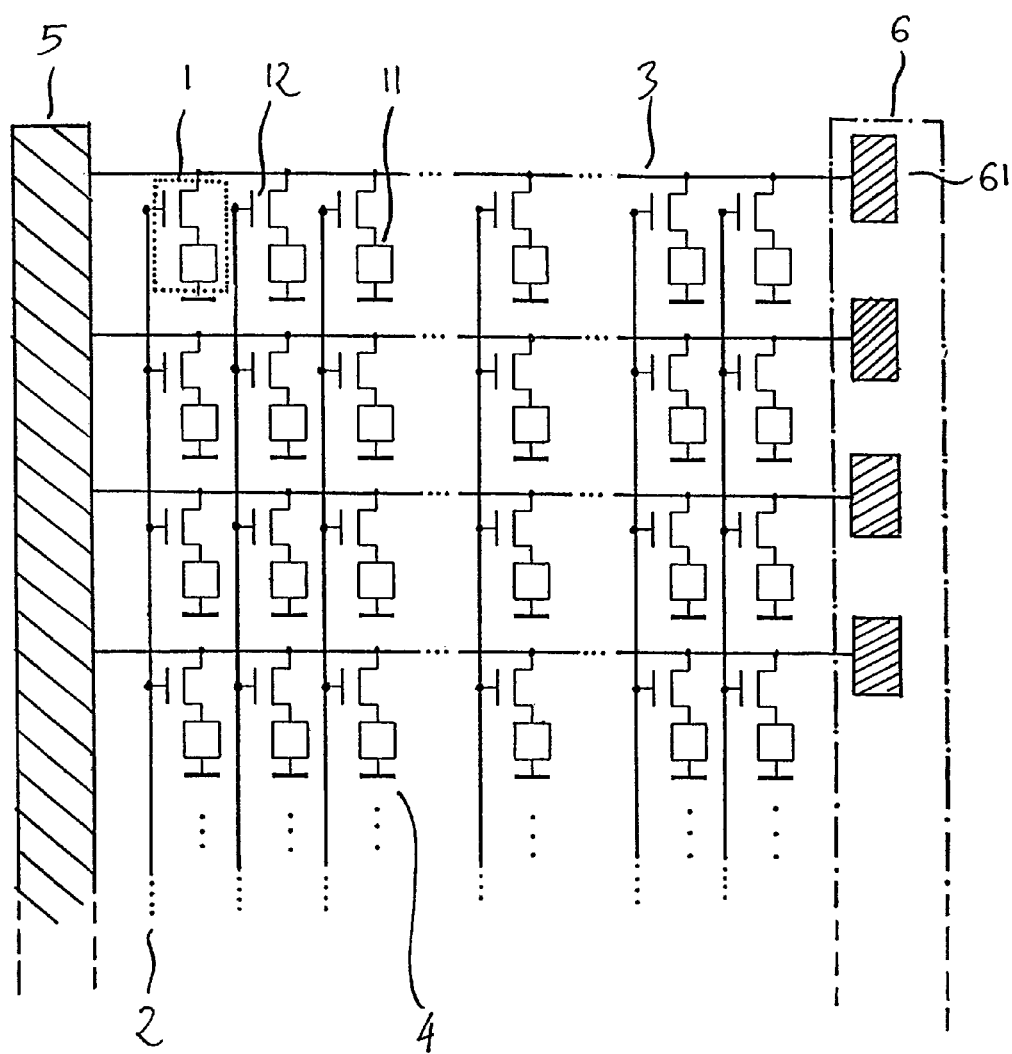
FIG. 1 shows a memory device, according to a first embodiment of the present invention.

FIG. 1 shows the memory device according to a first embodiment of the present invention. According to this embodiment, resistive memory cells 1 are arranged in an array in columns and rows. The resistive memory cell 1 comprises a resistive memory element 11 and a selection transistor 12. The resistive element 11 and the selection transistor 12 are arranged in a series connection between a bit line 3 and a reference electrode 4. In general, every bit line 3 is assigned to one column, and every word line 2 is assigned to one row. The selection transistor 12 of each resistive memory cell 1 is further connected to a word line 2. An evaluation device 6, comprising evaluation units 61, is capable to evaluate the resistive state of a resistive memory cell 1 by applying to and/or measuring electrical signals between the corresponding bit line 3 and the reference electrode 4, upon addressing the respective word line 2.

According to this embodiment of the present invention, the memory device further comprises a charging device 5. The charging device 5 is connected to every bit line 3 of the memory device. The charging device 5 is capable to bring the bit lines 3 to a well defined potential. Since the bit lines 3 are subject to capacitive coupling among themselves and to other components of the memory device, the bit lines 3 may be charged to an uncontrolled potential when left electrically floating. Similar charging effects may occur through leakage currents between the bit lines and other components of the memory device.

When the evaluation device 6 is to carry out an operation, the evaluation device 6 will apply and/or measure an electrical signal between the reference code 4 and the respective bit line 3. In order to carry out a reliable reading operation and determine the resistive state of the resistive memory cell 1 correctly, the evaluation device 6 needs to bring the bit lines 3 to a well defined pre-reading potential first. This operation is necessary before every reading operation if the potential of the bit lines 3 is not controlled by other means. The device will require a substantial delay before reading operations, and hence will possess only a limited overall performance.

According to this embodiment of the present invention, the memory device therefore further comprises a charging unit 5, which is able to bring the potential of the bit lines 3 to a well defined pre-reading potential, at a time when no reading operation is in progress. In this way, the charging device does not interfere with the evaluation device 6. Furthermore, it might not be necessary to bring the bit lines to a well defined pre-reading potential before every reading operation.

Since charging effects occur in characteristic time spans in the range of milliseconds, and modern memory devices operate in the range of nanoseconds for accessing the memory content, it is sufficient for the charging device 5 to bring the potential of the bit lines 3 to a well defined pre-reading potential only after every one thousand reading operations. In general, the maximum number $N_{max}$ of reading operations after a charging step is required, calculates from $$N_{max}=T_{ch}/T_{ro}, \qquad (1)$$

with the characteristic time $T_{ch}$ in which uncontrolled charging effects bring the bit lines to a critical potential, and the time $T_{ro}$ for a single reading operation.

The charging device 5 however, must not rely purely on the number of reading operations, since charging effects are independent of reading operations and in resistive memory devices, as in all modern random access memories, regular access to all the resistive memory cells is not given. Preferably, the charging device will accordingly bring the potential of the bit lines 3 to a well defined pre-reading potential either after a certain time span has elapsed or a certain number of reading operations have been carried out. In both said cases, the charging device 5 should not charge the bit lines 3 when the evaluation device 6 is active, and a reading operation is in progress, since the charging of the charging device 5 then may influence the reading of the evaluation device 6.

The inventive memory device relies on resistive memory cells 1 as its main component for storing information. Resistive memory cells 1 usually possess two or more distinguishable resistive states, to which two or more logical states correspond. As an example, the resistive memory cell 1 may be brought to a high and to a low resistive state, these two resistive states corresponding then to the two logical states "0" and "1". Since resistive memory media are capable to possess more than two distinguishable resistive states, the resistive memory cell 1 may also carry more than two logical states.

Examples for resistive memory media are perovskite cells, phase change cells, and solid electrolyte cells (PMC, CB-RAM). The latter, which also represent the most promising material system, metal ions are mobile within the solid electrolyte and hence can form conductive bridgings. These bridgings, comprising paths of metal ions or clusters thereof, may be formed and decomposed by respective electrical fields. In the case of solid electrolytes the resistive memory cell 1 may comprise a resistive memory element 11 including Germanium-Selenide (GeSe, GeSe$_2$), Germanium-Sulfide (GeS, GeS$_2$), Germanium-Telluride (GeTe), Silicon-Selenide (SiSe), Silicon-Sulfide (SiS), Lead-Sulfide (PbS), Lead-Selenide (PbSe), Lead-Telluride (PbTe), Tin-Sulfide (SnS), Tin-Selenide (SnSe), Tin-Telluride (SnTe), Zinc-Sulfide (ZnS), Zinc-Selenide (ZnSe), Cadmium-Sulfide (CdS), Cadmium-Selenide (CdSe), Copper (Cu), Silver (Ag), Zinc (Zn), Lithium (Li), or Sodium (Na).

Figure 2:
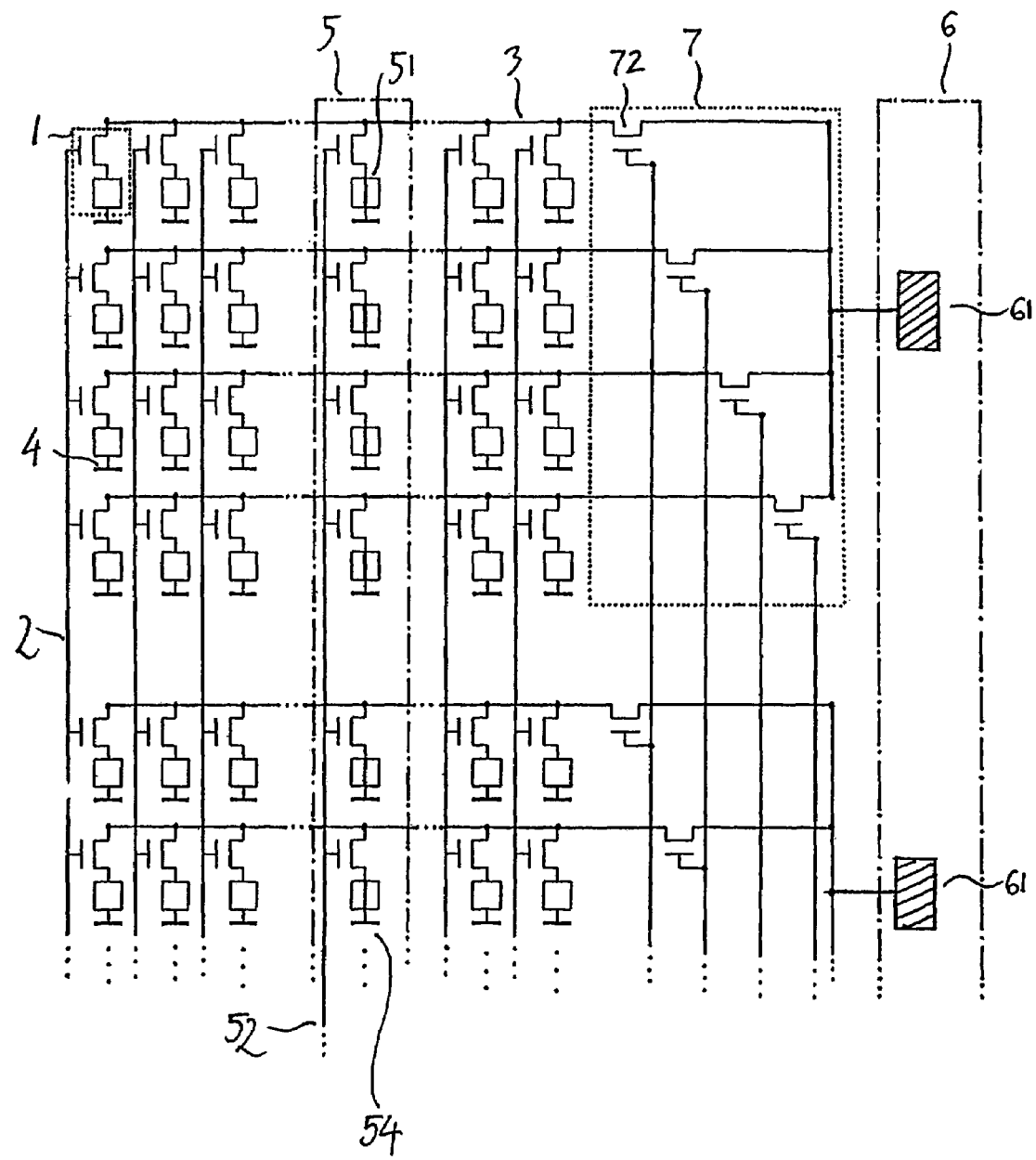
FIG. 2 shows a memory device, according to a second embodiment of the present invention.

FIG. 2 shows the memory device according to a second embodiment of the present invention. According to this embodiment, the charging device 5 is embedded into the array of resistive memory cells 1, comprising one row of resistive memory cells 1. The resistive memory cells 1 of the charging device 5 are programmed, such that their resistive memory elements 51 are in a low resistive state. Further, the selection transistors 12 of the resistive memory cells 1 of the charging device 5 are connected to a charging word line 52.

According to this embodiment of the present invention, the charging device 5 may be implemented by simply assigning one row of resistive memory cells 1 to the charging device 5. It is not necessary to integrate further or more complicated structures into the memory device to obtain the full functionality of the charging device 5. In particular the functionality of the charging device 5 may be realized in a memory device with resistive memory cells even a posteriori if no charging device 5 has been initially designed. Which row of the array of resistive memory cells 1 is used for the charging device 5 is dependent on the actual layout of the memory device.

As shown in this embodiment of the present invention, one of the inner rows is assigned to the charging device 5. It may be preferable to assign one of the central inner rows of the array of resistive memory cells 1 to the charging device 5, since then the charging device 5 is coupled to the bit lines at a point where it intersects the bit lines 3 into more or less equal sections. Although placing the charging device 5 in the centre of the array is not mandatory, and according to the present invention any row of the array of resistive memory cells 1 may be assigned to the charging device 5. Furthermore, the reference electrodes 54 of the resistive memory cells 1 of the charging device 5 may be either coupled to the reference electrodes 4 of the remaining resistive memory cells 1, or to a second common reference electrode of the charging device 5. In the latter case, the charging device 5 is able to bring the bit lines 3 to a well defined pre-reading potential independently from the reference electrodes 4.

According to this embodiment of the present invention, the memory device further comprises a multiplexing device 7. The multiplexing device 7 pools two or more of the bit lines 3 to a set of bit lines, and connects one of these bit lines via selection transistors 72 to an evaluation device 6 with evaluation units 61, while disconnecting the remaining bit lines 3 of the set from the evaluation device 6. Since it is not required to access all bit lines 3 at the same time, the evaluation device may comprise a reduced number of evaluation units 61 for evaluating the resistive state of a resistive memory cell 1. This greatly simplifies the overall layout of the memory device.

Evaluation of the resistive state of the resistive memory cells 1 is carried out via electrical signals between the respective bit line 3, which is selected by the multiplexing unit 7, and the reference electrode 4 upon addressing the respective word line 2. If a bit line 3 of a multiplexed set of bit lines is disconnected from the evaluation device 6 it may be electrically floating, giving rise to undesired charging effects of the respective bit line 3. According to the present invention, the charging device 5 may be employed here with its full advantage.

Figure 3:
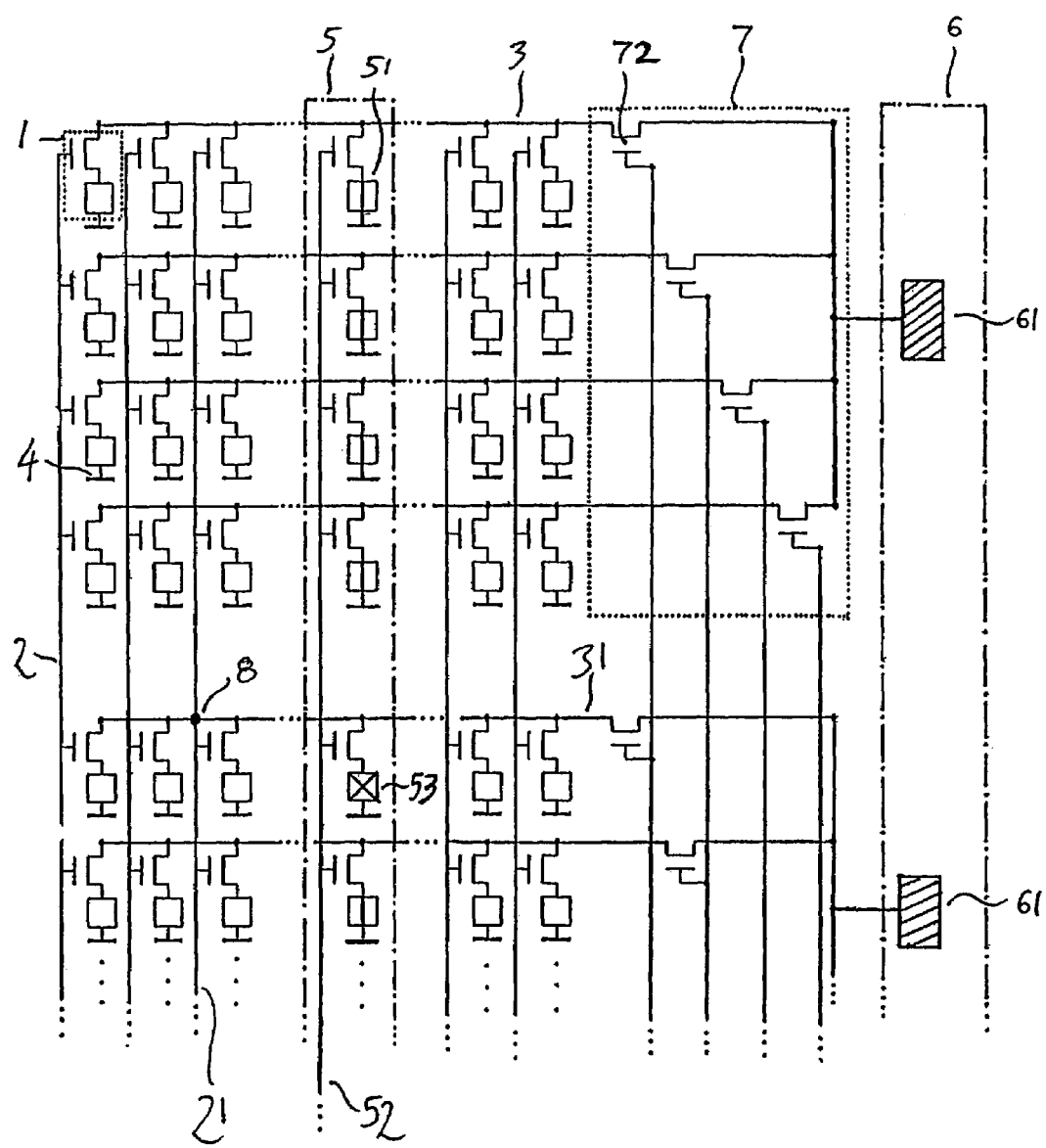
FIG. 3 shows a memory device, according to a third embodiment of the present invention.

FIG. 3 shows a schematic illustration of the memory device according to a third embodiment of the present invention. According to this embodiment, the charging device 5 is programmed such that the resistive memory cells 51 are all in a low resistive state, but at least one cell 53 is in a high resistive state. This differential programming is advantageous if the respective bit line 3 forms a short connection 8 with a word line 2.

During manufacturing of modern and highly integrated memory devices, irregularities and deviations from the originally intended lithography rather often occur. Since modern devices are highly integrated, these irregularities and deviations can be easily corrected via excluding faulty parts and replacing their respective function by redundantly integrated components. Short connections, as for example the short connection 8 of the bit line 31 and the word line 21, do not cause too much loss of overall functionality and performance of the device. In the case of the short 8, the column of resistive memory cells 1 which are coupled to the bit line 31 which is in the undesired short connection 8 with the word line 21, is simply disabled. Due to the very high dimensions of modern memory arrays, the disabling of a single row or a single column does not reduce the device functionality substantially. The bit line 31 may furthermore be replaced by a redundant spare bit line.

In order to exclude a faulty bit line also from charging, the charging device 5 is programmed such that the respective resistive memory cell 53 is in a high resistive state. Upon addressing the charging word line 52, the faulty bit line is therefore not connected to the potential of the charging reference electrode. A further advantage of the present invention is that the charging device 5, comprising resistive memory cells 1, can be programmed to have low resistive memory cells 51 and high resistive memory cells 53 in a very flexible way after the actual faulty bit lines have been determined. Most preferably, the programming of the charging device 5 is carried out after a testing setup has determined all faulty bit lines.

Figure 4A:
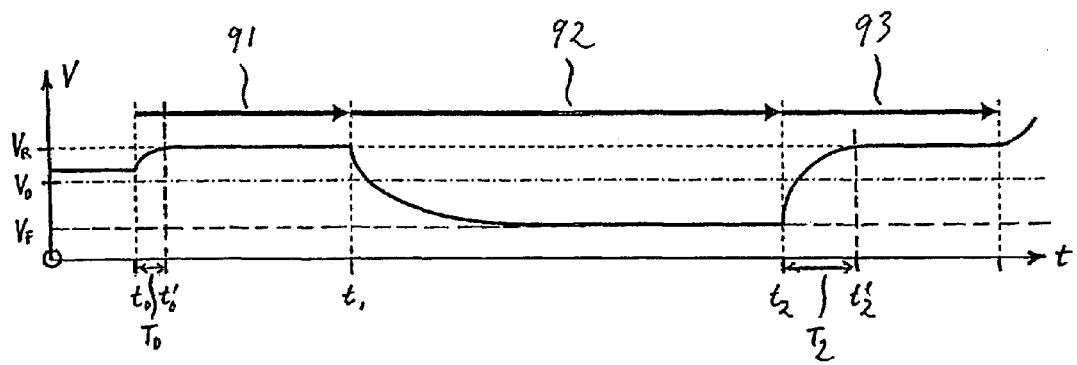
FIG. 4A shows the bit line potential versus time according to prior art.

FIG. 4A shows the bit line potential versus time according to prior art. The bit line potential V initially assumes an arbitrary value, for example a value between $V_0$ and $V_R$. During a first reading operation 91 the bit line potential V has to be brought to a reading potential $V_R$. Due to an inherent and a parasitic capacitance of the bit line, this will take a time $T_0$ from $t_0$ to $t_0'$. Once the bit line potential V has reached the reading potential $V_R$ the actual reading operation may commence and is carried out in the remainder of the operation 91. This operation 91 ends at a time $t_1$.

During a period 92, ranging from $t_1$ to $t_2$, the bit line is not accessed. Due to leakages toward neighbouring components of the memory device and capacitive coupling, the bit line potential V may vary uncontrolled and may also, as an example, assume a maximum floating voltage $V_F$. If a second reading operation 93 is to be carried out from a time $t_2$ onwards, the bit line potential V must be brought to $V_R$ before the actual reading operation may begin. Since the bit line potential V differs by $|V_F - V_R|$, it will take a longer time span $T_2$ from $t_2$ to $t_2'$, to bring the bit line potential V to the required reading potential $V_R$. As can be seen from this example, the time spans $T_0$ and $T_2$ may vary in an uncontrolled way, and, as a consequence, the actual reading operation must be delayed by the longest possible time span $T_{max}$ before the resistive state of a resistive memory cell may be evaluated. This is very disadvantageous, since a substantial delay before every reading operation is required.

Figure 4B:
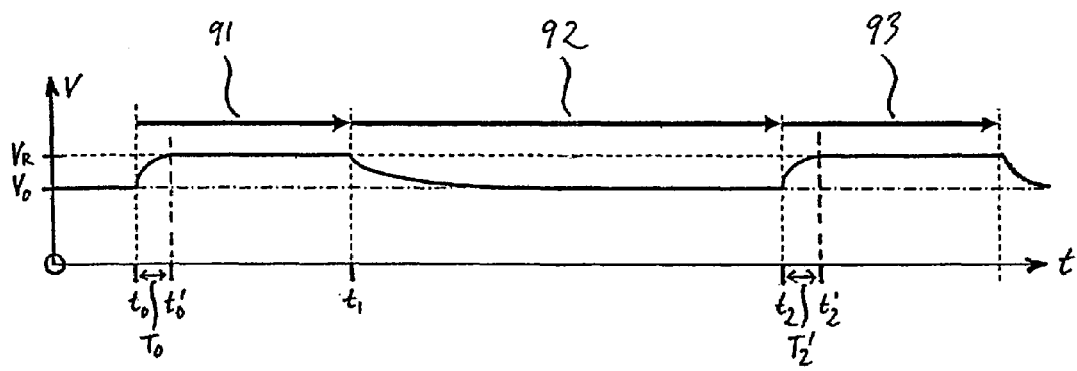
FIG. 4B shows the bit line potential versus time, according to a fourth embodiment of the present invention.

FIG. 4B shows the bit line potential V versus time according to a fourth embodiment of the present invention. According to this embodiment, the bit line potential V is brought by a charging device 5 to a well defined pre-reading potential $V_0$ between two consecutive reading operations 91 and 93. Therefore the bit line potential V is kept at a well defined and controlled potential $V_0$ during periods 92 when no reading operation is effective. As a consequence, the time spans $T_0$ and $T_2'$ will be equal upon initialisation of every reading operation, as shown here in the case of the operations 91 and 93. The delay, which is required before every reading operation may be carried out, is therefore always the same ($T_0$ equals $T_2'$ and can be tuned by the bias $V_0$. By controlling the bit line potential in idle periods 92, the delay is substantially reduced and the overall performance of the memory device is strongly enhanced in contrast to prior art, as for example shown in FIG. 4A.

Figure 4C:
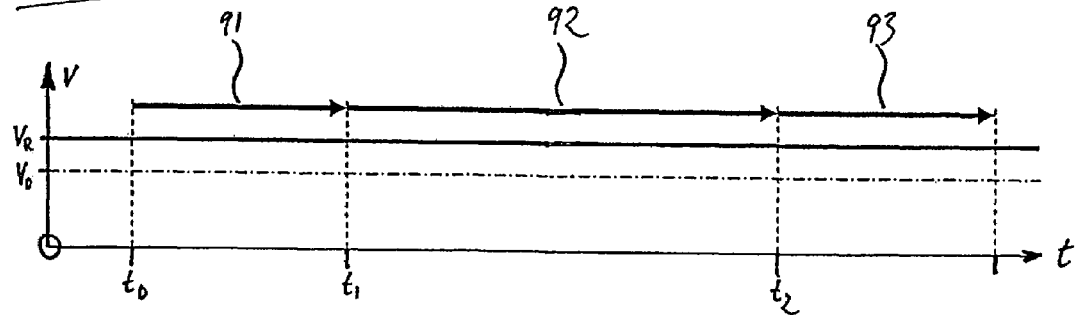
FIG. 4C shows the bit line potential versus time, according to a fifth embodiment of the present invention.

FIG. 4C shows the bit line potential V versus time according to a fifth embodiment of the present invention. According to this embodiment, the bit line potential V is kept by the charging device 5 at exactly or approximately the reading potential $V_R$. In this way, the bit line potential V equals $V_R$ also in periods 92 when no reading operation is effective. A subsequent reading operation 93 may therefore commence immediately. Most preferably the charging device 5 achieves a charging of the bit lines at the well defined pre-reading potential $V_R$, via being coupled to a separate charging reference electrode.

The preceding description only describes advantageous exemplary embodiments of the invention. The features disclosed therein and in the claims and the drawings can, therefore, be essential for the realization of the invention in its various embodiments, both individually and in any combination.

What is claimed is:

1. A memory device, comprising:
   an array of resistive memory cells, the resistive memory cells being arranged in columns and rows,
   the resistive memory cells each being connected to a word line, to a bit line, and to a reference electrode, the word lines being assigned to the rows and the bit lines being assigned to the columns,
   wherein a resistive state of the resistive memory cells corresponds to a logical state of the resistive memory cells;
   an evaluation device coupled to the bit lines for evaluating the resistive state of at least one of the resistive memory cells during a reading operation, the respective resistive memory cell being selected by addressing the word line to which the resistive memory cell is connected; and
   a charging device coupled to the bit lines, the charging device charging the bit lines to a pre-determined pre-reading bit line potential before carrying out a reading operation, the charging device comprising a further row of resistive memory cells, each memory cell being connected to a respective bit line.

2. The memory device as claimed in claim 1, the charging charging the bit lines to the pre-reading bit line potential at a time no reading operation is in progress.

3. The memory device as claimed in claim 2, the charging device charging the bit lines to a pre-reading bit line potential after at least every 1000th reading operation.

4. The memory device as claimed in claim 1, wherein the pre-reading bit line potential approximately matches the bit line potential during a reading operation.

5. The memory device as claimed in claim 1, wherein the absolute difference between the pre-reading bit line potential and the bit line potential during a reading operation is less than 2 Volt.

6. The memory device as claimed in claim 1, wherein the absolute difference between the pre-reading bit line potential and the bit line potential during a reading operation is less than 1 Volt.

7. The memory device as claimed in claim 1, wherein the absolute difference between the pre-reading bit line potential and the bit line potential during the reading operation is less than 0.1 Volt.

8. The memory device as claimed in claim 1, wherein the charging device is programmed such that a faulty bit line is excluded from the bit line charging operation.

9. The memory device as claimed in claim 1, the resistive memory cells of the charging device being programmed such that they are in a low resistive state.

10. The memory device as claimed in claim 9, wherein the resistive memory cells of the charging device are coupled to a common charging reference electrode.

11. The memory device as claimed in claim 9, wherein the resistive memory cells of the charging device are connected to a common charging word line.

12. The memory device as claimed in claim 9, wherein the resistive memory cells comprise a resistive memory element and a selection transistor arranged in a series connection between the corresponding bit line and the reference electrode, said selection transistor being further connected to the corresponding word line.

13. The memory device as claimed in claim 12, wherein the resistive memory element comprises a solid electrolyte element, including at least one of Germanium-Selenide (GeSe, GeSe2), Germanium-Sulfide (GeS, GeS2), Germanium-Telluride (GeTe), Silicon-Selenide (SiSe), Silicon-Sulfide (SIS), Lead-Sulfide (PbS), Lead-Selenide (PbSe), Lead-Telluride (PbTe), Tin-Sulfide (SnS), Tin-Selenide (SnSe), Tin-Telluride (SnTe), Zinc-Sulfide (ZnS), Zinc-Selenide (ZnSe), Cadmium-Sulfide (CdS), Cadmium-Selenide (CdSe), Copper (Cu), Silver (Ag), Zinc (Zn), Lithium (Li) and Sodium (Na).

14. A memory device, comprising:
   an array of resistive memory cells, the resistive memory cells being arranged in columns and rows,
   the resistive memory cells each being connected to a word line, to a bit line, and to a reference electrode, said word lines being assigned to the rows and said bit lines being assigned to the columns,
   wherein a resistive state of the resistive memory cells corresponds to a logical state of the resistive memory cells;
   an evaluation device coupled to the bit lines for evaluating the resistive state of at least one of the resistive memory cells during a reading operation, the respective resistive memory cell being selected by addressing the word line to which the resistive memory cell is connected;
   a multiplexing device coupled to at least two bit lines to connect one of the bit lines to the evaluation device; and
   a charging device coupled to the bit lines, the charging device charging the bit lines to a pre-determined pre-reading bit line potential before carrying out a reading operation, the charging device comprising a further row of resistive memory cells, each memory cell being connected to a respective bit line.

15. The memory device as claimed in claim 14, the charging device charging the bit lines to the pre-reading bit line potential at a time no reading operation is in progress.

16. The memory device as claimed in claim 14, the charging device charging the bit lines to a pre-reading bit line potential after at least every 1000th reading operation.

17. The memory device as claimed in claim 14, wherein the pre-reading bit line potential approximately matches the bit line potential during a reading operation.

18. The memory device as claimed in claim 14, wherein the absolute difference between the pre-reading bit line potential and the bit line potential during a reading operation is less than 2 Volt.

19. The memory device as claimed in claim 14, wherein the absolute difference between the pre-reading bit line potential and the bit line potential during a reading operation is less than 1 Volt.

20. The memory device as claimed in claim 14, wherein the absolute difference between the pre-reading bit line potential and the bit line potential during the reading operation is less than 0.1 Volt.

21. The memory device as claimed in claim 14, wherein the charging device is programmed such that a faulty bit line is excluded from the bit line charging operation.

22. The memory device as claimed in claim 14, the resistive memory cells of the charging device being programmed such that they are in a low resistive state.

23. The memory device as claimed in claim 22, the resistive memory cells of the charging device are coupled to a common charging reference electrode.

24. The memory device as claimed in claim 22, wherein the resistive memory cells of the charging device are connected to a common charging word line.

25. The memory device as claimed in claim 22, wherein the resistive memory cells comprise a resistive memory element and a selection transistor arranged in a series connection between the corresponding bit line and the reference electrode, the selection transistor being further connected to the corresponding word line.

26. The memory device as claimed in claim 25, wherein the resistive memory element comprises a solid electrolyte element, including at least one of Germanium-Selenide (GeSe, GeSe2), Germanium-Sulfide (GeS, GeS2), Germanium-Telluride (GeTe), Silicon-Selenide (SiSe), Silicon-Sulfide (SIS), Lead-Sulfide (PbS), Lead-Selenide (PbSe), Lead-Telluride (PbTe), Tin-Sulfide (SnS), Tin-Selenide (SnSe), Tin-Telluride (SnTe), Zinc-Sulfide (ZnS), Zinc-Selenide (ZnSe), Cadmium-Sulfide (CdS), Cadmium-Selenide (CdSe), Copper (Cu), Silver (Ag), Zinc (Zn), Lithium (Li) and Sodium (Na).

* * * * *